United States Patent [19]

Koike

[11] Patent Number: 4,499,416
[45] Date of Patent: Feb. 12, 1985

[54] REFERENCE VOLTAGE CIRCUIT FOR OBTAINING A CONSTANT VOLTAGE IRRESPECTIVE OF THE FLUCTUATIONS OF A POWER SUPPLY VOLTAGE

[75] Inventor: Hideharu Koike, Yokohama, Japan

[73] Assignee: Tokyo Shibaura Denki Kabushiki Kaisha, Japan

[21] Appl. No.: 443,630

[22] Filed: Nov. 22, 1982

[30] Foreign Application Priority Data

Nov. 25, 1981 [JP] Japan .................................. 56-188843

[51] Int. Cl.$^3$ ................................................. G05F 5/00
[52] U.S. Cl. .................................... 323/303; 307/297; 307/304; 323/313
[58] Field of Search ................ 307/297, 304; 323/303, 323/304, 311, 313

[56] References Cited

U.S. PATENT DOCUMENTS

| | | | |
|---|---|---|---|
| 3,975,649 | 8/1976 | Kawagoe et al. | 307/304 |
| 4,298,811 | 11/1981 | Salters et al. | 307/304 |
| 4,451,744 | 5/1984 | Adam | 307/297 |
| 4,453,121 | 6/1984 | Noufer | 323/313 |

FOREIGN PATENT DOCUMENTS

| | | |
|---|---|---|
| 0029231 | 5/1981 | European Pat. Off. . |
| 112618 | 8/1980 | Japan .................... 323/313 |
| 44917 | 4/1981 | Japan .................... 323/311 |
| 87224 | 5/1982 | Japan .................... 323/311 |
| 1298395 | 11/1972 | United Kingdom . |
| 1392049 | 4/1975 | United Kingdom . |
| 1547324 | 7/1979 | United Kingdom . |
| 2031193 | 4/1980 | United Kingdom . |
| 2081940 | 2/1982 | United Kingdom . |

Primary Examiner—William H. Beha, Jr.
Attorney, Agent, or Firm—Finnegan, Henderson, Farabow, Garrett & Dunner

[57] ABSTRACT

A reference voltage circuit comprising a first resistor connected between a first power supply voltage terminal and a reference voltage terminal, and a second resistor connected between a second power supply voltage terminal and the reference voltage terminal. The reference voltage circuit further has a MOSFET, the drain of which is connected to the reference voltage terminal, the source of which is connected to the first power supply voltage terminal, and the gate of which is connected to the second power supply voltage terminal with proper selection of the second resistor in relationship to $\beta$ of the MOSFET and the reference voltage, the reference voltage may be kept constant irrespective of fluctuations in the power supply voltage. In other embodiments, the first and second resistors can be replaced with different types of MOSFETs to reduce the pattern area of the reference voltage circuit.

8 Claims, 5 Drawing Figures

F I G. 1
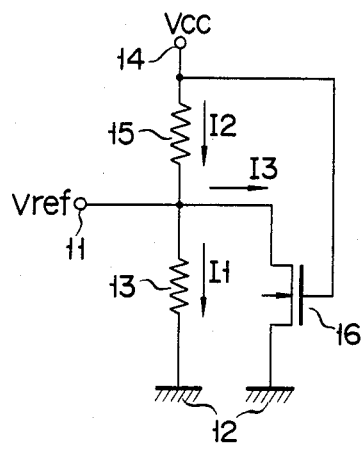
F I G. 2
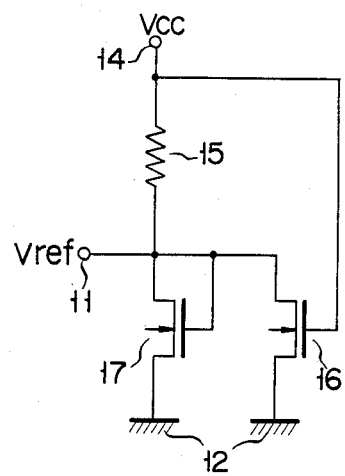
F I G. 3
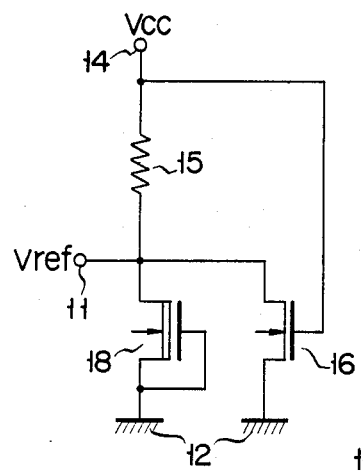
F I G. 4
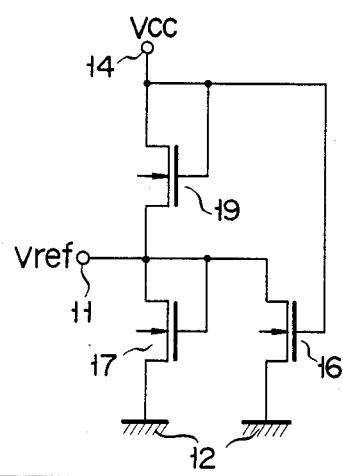
F I G. 5
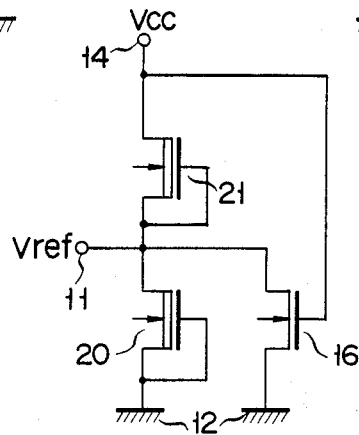

4,499,416

REFERENCE VOLTAGE CIRCUIT FOR OBTAINING A CONSTANT VOLTAGE IRRESPECTIVE OF THE FLUCTUATIONS OF A POWER SUPPLY VOLTAGE

BACKGROUND OF THE INVENTION

The present invention relates to a reference voltage circuit for generating a reference voltage.

A circuit is conventionally proposed as a reference voltage circuit built into an integrated circuit to produce a reference voltage $V_{ref}$ by dividing a power supply voltage $V_{cc}$ by a resistor.

In the conventional reference voltage circuit, however, the reference voltage $V_{ref}$ varies due to fluctuations in the power supply voltage $V_{cc}$. As a result, the stable reference voltage $V_{ref}$ cannot be generated over a wide range of power supply voltages.

SUMMARY OF THE INVENTION

It is an object of the present invention to provide a reference voltage circuit for generating a stable reference voltage over a wide range of power supply voltages.

In order to achieve the above object of the present invention, there is provided a reference voltage circuit, comprising: a first resistive means, connected between a first power supply voltage terminal and a reference voltage terminal; a second resistive means, connected between a second power supply voltage terminal and said reference voltage terminal; and a first transistor, the drain thereof being connected to said reference voltage terminal, the source thereof being connected to said first power supply voltage terminal, and the gate thereof being connected to said second power supply voltage terminal.

According to the present invention, since the gate terminal of the MOSFET is connected to the second power supply voltage terminal, the resistance of the MOSFET changes in accordance with changes in the power supply voltage $V_{cc}$. As a result, the reference voltage $V_{ref}$ at the reference voltage terminal can be kept constant.

BRIEF DESCRIPTION OF THE DRAWINGS

FIG. 1 is a circuit diagram of a reference voltage circuit according to a first embodiment of the present invention;

FIG. 2 is a circuit diagram of a reference voltage circuit according to a second embodiment of the present invention;

FIG. 3 is a circuit diagram of a reference voltage circuit according to a third embodiment of the present invention;

FIG. 4 is a circuit diagram of a reference voltage circuit according to a fourth embodiment of the present invention; and FIG. 5 is a circuit diagram of a reference voltage circuit according to a fifth embodiment of the present invention.

DETAILED DESCRIPTION OF THE PREFERRED EMBODIMENTS

A reference voltage circuit according to a first embodiment of the present invention will be described with reference to FIG. 1. In the reference voltage circuit shown in FIG. 1, a resistor 13 having a resistance $R_1$ is connected between a reference voltage terminal 11 and ground 12. A resistor 15 having a resistance $R_2$ is connected between the reference voltage terminal 11 and a power supply voltage terminal 14. The gate of an enhancement-type n-channel metal oxide semiconductor field effect transistor 16 (to be referred to as a MOSFET 16 hereinafter) is connected to the power supply voltage terminal 14. The drain of the MOSFET 16 is connected to the reference voltage terminal 11. The source of the MOSFET 16 is grounded.

In the reference voltage circuit of the configuration described above, when the power supply voltage $V_{cc}$ supplied to the power supply voltage terminal 14 is increased by $\Delta V_{cc}$, an increment $\Delta I_2$ in current $I_2$ flowing through the resistor 15 is given by equation (1):

$$\Delta I_2 = \Delta V_{cc}/R_2 \tag{1}$$

Meanwhile, if the reference voltage $V_{ref}$ at the reference voltage terminal 11 is kept unchanged, then the increment in current $I_1$ flowing through the resistor 13 defined as $\Delta I_1$ must be zero. Then the following relation is given: $\Delta I_1 = 0$.

When $V_{cc} - V_{t1} > V_{ref}$ where $V_{t1}$ is a threshold voltage of the MOSFET 16, the MOSFET 16 is in the triode region. A current $I_3$ flowing through the MOSFET 16 is given by equation (2):

$$I_3 = \beta_1\{(V_{cc}-V_{t1})V_{ref} - V_{ref}^2/2\} \tag{2}$$

$$\text{for } \beta_1 = (W/L)\cdot(\epsilon\cdot\mu/t) \tag{3}$$

where
W is the gate width of the MOSFET 16,
L is the gate length of the MOSFET 16,
$\epsilon$ is the permittivity of the gate oxide film,
t is the thickness of the gate oxide film, and
$\mu$ is the surface mobility of the substrate.

An increment $\Delta I_3$ in the current $I_3$ is, therefore, given by equation (4):

$$\Delta I_3 = (\delta I_3/\delta V_{cc})\cdot \Delta V_{cc} = \beta_1 \cdot V_{ref} \Delta V_{cc} \tag{4}$$

Furthermore, the increment $\Delta I_2$ in the current $I_2$ is given by equation (5):

$$\Delta I_2 = \Delta I_1 + \Delta I_3 \tag{5}$$

According to equations (1), (4) and (5), the resistance $R_2$ is given by equation (6):

$$R_2 = 1/(\beta_1 \cdot V_{ref}) \tag{6}$$

As may be apparent from the above description, when the resistance $R_2$ of the resistor 15 is given by equation (6), the reference voltage $V_{ref}$ can be kept unchanged in spite of the change of the power supply voltage $V_{cc}$.

The resistance $R_1$ of the resistor 13 is determined uniquely by the reference voltage $V_{ref}$, the resistance $R_2$ of the resistor 15, the constant $\beta_1$ of the MOSFET 16, and the threshold voltage $V_{t1}$ thereof as follows.

$$I_1 = I_2 - I_3 = (V_{cc}-V_{ref})/R_2 - \beta_1\{(V_{cc}-V_{t1})\cdot V_{ref} - V_{ref}^2/2\} \tag{7}$$

Further, $$I_1 = V_{ref}/R_1 \tag{8}$$

According to equations (7) and (8), the following relation is given:

$$1/R_1 = (V_{cc} - V_{ref})/(V_{ref} R_2) - \beta_1 \{(V_{cc} - V_{t1}) - V_{ref}/2\} \quad (9)$$

The resistance $R_1$ of the resistor 13 is determined by the relation (9).

As described above, in the reference voltage circuit shown in FIG. 1, the resistances $R_1$ and $R_2$ are determined by equations (9) and (6), respectively.

FIG. 2 shows a reference voltage circuit according to a second embodiment of the present invention. The reference voltage circuit of the second embodiment is the same as that of the first embodiment, except that an enhancement-type n-channel MOSFET 17 whose gate is connected to the drain thereof is used in place of the resistor 13. In this case, the MOSFET 17 requires the smaller area than that of the resistor 13 of FIG. 1. A constant $\beta_2$ of the MOSFET 17 is determined uniquely by the threshold voltage $V_{t2}$ thereof, the reference voltage $V_{ref}$, the resistance $R_2$, and the constant $\beta_1$ of the MOSFET 16. A current $I_1$ flowing through the MOSFET 17 is given by the equation (10).

$$I_1 = \beta_2 (V_{ref} - V_{t2})^2 / 2 \quad (10)$$

Solving equations (7) and (10), the constant $\beta_2$ is obtained as follows:

$$\beta_2 = [2/(V_{ref} - V_{t2})^2] \cdot [(V_{cc} - V_{ref})/R_2 - \beta_1\{(V_{cc} - V_{t1}) \cdot V_{ref} - V_{ref}^2/2\}] \quad (11)$$

FIG. 3 shows a reference voltage circuit according to a third embodiment of the present invention. The reference voltage circuit of the third embodiment is the same as that of the second embodiment, except that a depletion-type n-channel MOSFET 18 whose gate is connected to the source thereof is used in place of the enhancement-type n-channel MOSFET 17. When the enhancement-type n-channel MOSFET 17 is used, the reference voltage $V_{ref}$ cannot be reduced lower than the threshold voltage $V_{t2}$. Therefore, the range of the reference voltage $V_{ref}$ falls in the range of $V_{t2}$ to $(V_{cc} - V_{t1})$. However, when the depletion-type n-channel MOSFET 18 is used, the range of the reference voltage is as wide as the range of 0 to $(V_{cc} - V_{t1})$.

FIG. 4 shows a reference voltage circuit according to a fourth embodiment of the present invention. The reference voltage circuit of the fourth embodiment is the same as that of the second embodiment, except that an enhancement-type n-channel MOSFET 19 whose gate is connected to the drain thereof is used in place of the resistor 15. The MOSFET 19 requires the smaller area than that of the resistor 15 in FIG. 2.

Equation (6) is no longer valid for the reference voltage circuit shown in FIG. 4. However, a relation similar to equation (6) can be obtained by approximating the MOSFET 19 to a linear resistance. Since a current $I_2$ flowing through the MOSFET 19 is a function of the power supply voltage $V_{cc}$, a differential resistance $r_2$ of the MOSFET 19 is given by equation (12):

$$1/r_2 = (\delta I_2 / \delta V_{cc})_{V_{cc} = V_0} \quad (12)$$

for $V_0 =$ constant (5 V for example).

If the differential resistance $r_2$ is regarded as $R_2$ for $V_{cc} = V_0$, $1/r_2$ is given using equations (6) and (12) as follows:

$$(\delta I_2 / \delta V_{cc})_{V_{cc} V_0} = \beta_1 \cdot V_{ref} \quad (13)$$

Equation (13) indicates the general relation which is obtained using a nonlinear resistance such as MOSFET 9 in place of the resistor 15. Equation (13) is valid as long as the change in the power supply voltage $V_{cc}$ is relatively small.

FIG. 5 shows a reference voltage circuit according to a fifth embodiment of the present invention. The reference voltage circuit of the fifth embodiment is the same as that of the fourth embodiment, except that depletion-type MOSFETs 20 and 21, the respective gates of which are connected to the respective sources thereof, are used in place of the enhancement-type n-channel MOSFETs 17 and 19. When the enhancement-type MOSFETs 17 and 19 are used, the reference voltage $V_{ref}$ falls in a narrow range of $V_{t2}$ to $(V_{cc} - V_{t1})$. However, when the depletion-type MOSFETs 20 and 21 are used, the range of the reference voltage $V_{ref}$ remains as wide as a range of 0 to $(V_{cc} - V_{t1})$, in the same manner as the circuit shown in FIG. 3.

The present invention is not limited to the above embodiments shown in FIGS. 1 to 5. In the above embodiments, the transistor connected between the reference voltage terminal 11 and the ground comprises the n-channel MOSFET 16. However, if a negative power source voltage $V_{cc}$ is used, the n-channel MOSFET 16 must be replaced by a p-channel MOSFET. Furthermore, in a special case, in the first embodiment, when the current $I_1$ becomes zero, the resistance $R_1$ of the resistor 13 becomes infinite, as is apparent from equation (8). In other words, it is possible to arrange the reference voltage circuit using only the resistor 15 and the MOSFET 16 and without using the resistor 13. In this case, the space required for the circuit configuration is decreased as compared with the embodiment in FIG. 1.

What is claimed is:

1. A reference voltage circuit for obtaining a constant reference voltage irrespective of the fluctuations of a power supply voltage, having a first power supply voltage terminal, a reference voltage terminal and a second power supply voltage terminal, said reference voltage circuit comprising:

a first resistor, connected between said first power supply voltage terminal and said reference voltage terminal;

a second resistor, connected between said second power supply voltage terminal and said reference voltage terminal; and a first metal oxide semiconductor field effect transistor, the drain thereof being connected to said reference voltage terminal, the source thereof being connected to said first power supply voltage terminal, and the gate thereof being connected to said second power supply voltage terminal, wherein said second resistor has a resistance $R_2$, said first transistor has a constant $\beta$, and a reference voltage $V_{ref}$ is obtained at said reference voltage terminal, with the relationship between $R_2$, $\beta$, and $V_{ref}$ being as follows:

$$R_2 = 1/(\beta \cdot V_{ref})$$

for $\beta = (W/L) \cdot (\epsilon \cdot \mu / t)$ where

W is the gate width of said transistor,

L is the gate length of said transistor, $\epsilon$ is the permittivity of a gate oxide film of said transistor, t is the thickness of said gate oxide film of said transistor, and $\mu$ is the surface mobility of the substrate.

2. A circuit according to claim 1, wherein said first resistor has a resistance $R_1$ which has the following relationship with the resistance $R_2$:

$$1/R_1 = (V_{cc} - V_{ref})/(V_{ref} R_2) - \beta\{(V_{cc} - V_t) - V_{ref}/2\}$$

where $V_{cc}$ is the power supply voltage, and $V_t$ is the threshold voltage of said transistor.

3. A reference voltage circuit for obtaining a constant reference voltage irrespective of the fluctuations of a power supply voltage, having a first power supply voltage terminal, a reference voltage terminal and a second power supply voltage terminal, said reference voltage circuit comprising:

a first metal oxide semiconductor field effect transistor, the drain thereof being connected to said reference voltage terminal, the source thereof being connected to said first power supply voltage terminal, and the gate thereof being connected to said second power supply voltage terminal;

a second metal oxide semiconductor field effect transistor, the drain thereof being connected to said reference voltage terminal and the source thereof being connected to said first power supply voltage terminal; and a resistor, connected between said second power supply voltage terminal and said reference voltage terminal; wherein said resistor has a resistance $R_2$, said first transistor has a constant $\beta$, and a reference voltage $V_{ref}$ is obtained at said reference voltage terminal, with the relationship between $R_2$, $\beta$, and $V_{ref}$ being as follows:

$$R_2 = 1/(\beta \cdot V_{ref})$$

for $\beta = (W/L) \cdot (\epsilon \cdot \mu / t)$ where

W is the gate width of said first transistor,

L is the gate length of said first transistor, $\epsilon$ is the permittivity of the gate oxide film of said first transistor, t is the thickness of said gate oxide film of said first transistor, and $\mu$ is the surface mobility of the substrate.

4. A circuit according to claim 3, wherein said second transistor is an enhancement-type metal oxide semiconductor field effect transistor, the gate thereof being connected to the drain thereof.

5. A circuit according to claim 3, wherein said second transistor is depletion-type metal oxide semiconductor field effect transistor, the gate thereof being connected to the source thereof.

6. A reference voltage circuit for obtaining a constant reference voltage irrespective of the fluctuations of a power supply voltage, having a first power supply voltage terminal, a reference voltage terminal and a second power supply voltage terminal, said reference voltage circuit comprising:

a first metal oxide semiconductor field effect transistor, the drain thereof being connected to said reference voltage terminal, the source thereof being connected to said first power supply voltage terminal, and the gate thereof being connected to said second power supply voltage terminal, a second transistor, the drain thereof being connected to said reference voltage terminal and the source thereof being connected to said first power supply voltage terminal; and a third transistor, the drain thereof being connected to said second power supply voltage terminal and the source thereof being connected to said reference voltage terminal, wherein said third transistor operates as a nonlinear resistive element having a differential resistance $r_2$, said first transistor has a constant $\beta$, and said reference voltage terminal has a reference voltage $V_{ref}$, the relationship between $r_2$, $\beta$ and $V_{ref}$ being as follows:

$$r_2 = 1/(\beta \cdot V_{ref})$$

for $\beta = (W/L) \cdot (\epsilon \cdot \mu / t)$, and $$1/r_2 = (\delta I_2 / \delta V_{cc}) V_{cc} = \text{constant}$$

where

W is the gate width of said first transistor,

L is the gate length of said first transistor, $\epsilon$ is the permittivity of a gate oxide film of said first transistor, t is the thickness of said gate oxide film of said first transistor, $\mu$ is the surface mobility of the substrate, $I_2$ is the current flowing through said nonlinear resistive element, and $V_{cc}$ is the second power supply voltage.

7. A circuit according to claim 6, wherein said second and third transistors are enhancement-type metal oxide semiconductor field effect transistors, the gates thereof being connected to the respective drains.

8. A circuit according to claim 6, wherein said second and third transistors are depletion-type metal oxide semiconductor field effect transistors, the gates thereof being connected to the respective sources.

* * * * *